United States Patent [19]

Hoang

[11] Patent Number: 5,530,400

[45] Date of Patent: Jun. 25, 1996

[54] TRANSISTOR CIRCUIT WITH TRANSISTOR CHARACTERISTIC SENSOR

[75] Inventor: Chinh L. Hoang, San Diego, Calif.

[73] Assignee: General Instruments Corp., Hatboro, Pa.

[21] Appl. No.: 170,701

[22] Filed: Dec. 21, 1993

Related U.S. Application Data

[63] Continuation of Ser. No. 800,208, Nov. 29, 1991, abandoned.

[51] Int. Cl.⁶ ............ G06G 7/12; H03K 17/14; H03K 17/296; H03K 17/62
[52] U.S. Cl. .......... 327/362; 327/378; 327/395; 327/403; 327/404; 327/566; 327/336
[58] Field of Search ............... 327/261, 262, 327/263, 264, 266, 269, 270, 272, 274, 108, 112, 391, 393, 427, 437, 362, 365, 378, 395, 403, 404, 336, 566; 326/30, 32, 82, 83

[56] References Cited

U.S. PATENT DOCUMENTS

| | | | |
|---|---|---|---|
| 4,797,579 | 1/1989 | Lewis | 326/30 |
| 5,130,564 | 7/1992 | Sin | 327/379 |
| 5,164,621 | 11/1992 | Miyamoto | 327/264 |
| 5,170,073 | 12/1992 | Hahn et al. | 327/261 |

*Primary Examiner*—David C. Nelms
*Assistant Examiner*—Trong Phan
*Attorney, Agent, or Firm*—Henry I. Schanzer

[57] ABSTRACT

Circuits embodying the invention include means for sensing certain characteristics (e.g. speed of response and conductivity) of the transistors formed on an integrated circuit (IC) and for using the sensed results to control the operation and structure of a circuit formed on the IC. An output driver circuit embodying the invention includes numerous pull-up transistors connected in parallel between a high power supply line and an output terminal and numerous pull-down transistors connected in parallel between the output terminal and the low power supply line. The number of transistors which are turned-on at any one time is selectively controlled as a function of the characteristics (e.g. conductivity and speed of response) of the transistors of the circuit. The higher the speed of response or the conductivity of the transistors, the fewer the number of pull-up or pull-down transistors which are turned-on.

33 Claims, 7 Drawing Sheets

TRANSISTOR CIRCUIT WITH TRANSISTOR CHARACTERISTIC SENSOR

This application is a continuation of U.S. application Ser. No. 07/800,208, filed Nov. 29, 1991, abandoned.

BACKGROUND OF THE INVENTION

This invention relates to means for sensing certain characteristics of the transistors of a circuit and for using information relating to the characteristics for controlling the operation of the circuit.

The design of many circuits and their proper operation depends on the components of the circuits having certain characteristics. For example, an output driver may include a first pull-up transistor connected beteween a first power supply terminal and a load terminal and a second pull-down transistor connected between the load terminal and a second power terminal. Normally, the pull-up and pull-down transistors are designed to be turned on at different times whereby when the pull-up transistor is turned-on, the pull-down transistor is turned-off and when the pull-down transistor is turned-on, the pull-up is turned-off. In addition, in the design of the output driver, it is assumed that the transistors have a certain conductivity when they are turned-on in order to drive the output terminal high or low within a preset period and at a predetermined current level with a given load.

When the characteristics of the actual transistors used in the circuit vary significantly from the assumed values, significant errors and problems arise in the operation of the circuit. Three factors which may significantly affect the characterisitics of the transistors of a circuit are:

(1) process variation;

(2) power supply variation; and (3) temperature variation.

The problem with process variation is that the components formed during one run may have significantly different characteristics than those formed during a subsequent run, even though both runs use the same process steps and are carried out under a very similar environment. For example, the main conduction paths of transistors formed during one run may have a lower equivalent impedance (higher conductivity) than those formed during another run. Transistors with a lower equivalent impedance would have a higher conductivity and be able to produce more current for the same bias condition. Consequently, these transistors appear to be faster since they could charge or discharge a node faster than transistors having a higher equivalent impedance.

The value of the operating potential applied to the transistors of a circuit also has a significant effect on the characteristics of the components of the circuit. For example, as the voltages across the different terminals of a Metal-Oxide-Semiconductor (MOS) transistor increase, the conductivity and effective speed of response of the MOS transistor increase, since the transistor can supply more current.

With regard to temperature variation, as the ambient temperature increases, MOS transistors exhibit a higher equivalent impedance (lower conductivity) whereby they pass less current and are effectively slower than at lower temperature.

Referring, for example, to the output driver circuit, the variations in the characteristics of the transistors constituting the circuit may be such that when the transistors of the circuit exhibit a high conductivity, the speed of response is such that very large currents flow along the power supply lines generating large negative voltage drops (glitches) along the positive power supply lines and large positive voltage drops along the negative or ground return lines. The glitches produce a whole range of noise signals which may be coupled to the driver circuit and other circuitry formed on the same integrated circuit as the output driver circuit. For example, a threefold increase in the speed of response of the transistors causes a ninefold increase in the magnitude of the glitches [where the glitches are caused by both the speed of response of the driver transistors and the rate of change of their input signals]. Also, when the transistors of the circuit have high conductivity, there is a greater tendency for the pull-up and pull-down transistors of the circuit to be turned-on at the same time causing spike through (i.e. large current spikes passed via the transistors between the positive and negative supply line).

On the other hand, if the pull-up and pull-down transistors exhibit low conductivity and appear to be very slow, then the signal generated at the output terminal (and/or to the load connected thereto) may not be able to drive the output terminal to a desired level within a desired period of time for a given load. This may result in the production of erroneous signal information at the circuit output.

In practice, a designer will design a circuit taking into account the worst case condition. For purpose of illustration and using MOS transistors as an example, the worst case condition would be the one for which the process is "slow", the operating potential is low and the temperature is high. Thus, in the design of a driver circuit, pull-up and pull-down driver transistors would be sized to provide the needed load currents under the worst case condition. In addition, circuitry controlling the driver transistors would be designed to turn them on as quickly as possible. As a result of this design, if there is any improvement in process speed, operating potential or temperature, the drivers will turn-on faster and harder causing larger than needed currents to flow with the concurrent production of noise signals. Under the best condition of process, potential and temperature, the circuit would be significantly over-designed and produce large glitches and noise signals.

In brief, the problem to be resolved is the design of a circuit which operates within a set of specifications under the most extreme conditions. For the case of a driver circuit employing MOS transistors, one extreme condition (high conductivity/high speed of response) occurs when the process is "fast", the power supply is "high" and the temperature is "low"; and the other extreme condition (low conductivity/low speed of response) occurs when the process is "slow", the power supply is "low" and the temperature is "high".

SUMMARY OF THE INVENTION

The prior art problems are resolved in circuits embodying the invention by sensing certain characteristics (e.g. speed of response and conductivity) of the transistors forming a circuit.

The invention resides in means for sensing certain characteristics of the transistors formed on an integrated circuit.

The invention also resides in means for sensing the characteristics of the transistors of an integrated circuit and in using the sensed results to control the operation and structure of a circuit formed on the integrated circuit.

Still another aspect of the invention resides in an output driver circuit which includes numerous pull-up transistors connected in parallel between a high power supply line and an output terminal and numerous pull-down transistors connected in parallel between the output terminal and the low power supply line and means for selectively controlling the number of transistors which are turned-on at any one time as a function of the characteristics (e.g. conductivity and speed of response) of the transistors of the circuit.

BRIEF DESCRIPTION OF THE DRAWINGS

In the accompanying drawings, like reference characters denote like components.

DETAILED DESCRIPTION OF THE INVENTION

Figure 1:
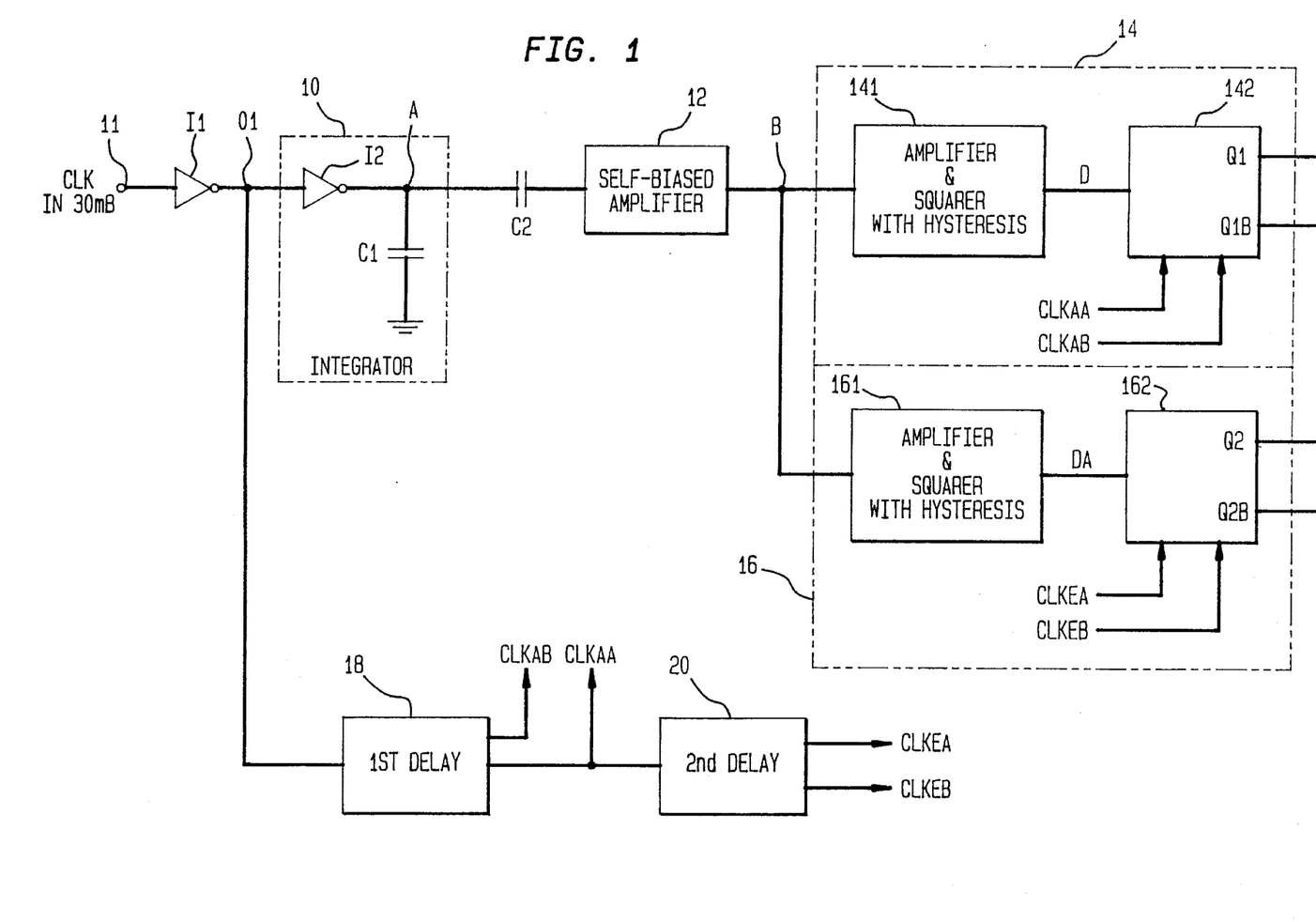
FIG. 1 is a block diagram of a circuit embodying the invention.

The circuit of FIG. 1 includes means for generating a signal whose amplitude is a function of the conductivity of the transistors of the circuit and means for measuring the amplitude and length of time the amplitude is above a predetermined level to determine the conductivity and speed of response of the transistors of the circuit. The circuit components shown in FIG. 1 are assumed to be formed on the same integrated circuit (IC) and include circuitry for sensing the conductivity of the transistors formed on the IC.

FIG. 1 includes an inverter I1 having an input to which is applied a high frequency input clock signal identified as 30 MB, and having an output (O1) which is connected to the input of an integrating network 10. The output (A) of network 10 is AC coupled via a capacitor C2 to the input of a self-biased inverting amplifier 12. The output (B) of amplifier 12 is applied to the inputs of networks 14 and 16. Each one of networks 14 and 16 senses the level at the output (B) of amplifier 12. When the signal at B is more positive than a certain threshhold voltage, VT1, a high level signal (VDD volts or logic 1) is produced by amplifiers 141 and 161 and applied to inputs D and DA of flip flops 142 and 162, respectively. When the signal at B is less positive than the threshhold voltage VT1, a low level signal (0 volts or logic "0") is produced by amplifiers 141 and 161 and applied to inputs D and DA, respectively.

Flip flop 142 in network 14 is controlled by complementary clocks AA and AB. When clock AA goes from low-to-high, the value of D is clocked into flip flop 142 and when the clock AB goes from low-to-high, the output Q1 of flip flop 142 is driven to the latched value of D. Flip flop 162 in network 16 is controlled by complementary clocks EA and EB. When clock EA goes from low-to-high, the value of DA is clocked into flip flop 162 and when clock EB goes from low-to-high, the output Q2 of flip flop 162 is driven to the latched value of DA. Thus flip flop 142 is used to sample the value of the signal D during a first sampling interval defined by clock AA and flip flop 162 is used to sample the value of the signal DA (which is equal to D) during a second sampling interval, which is subsequent to the first sampling interval.

If D and DA are "high" during the first and second sampling intervals, the outputs Q1 and Q2 of flip flops 142 and 162 will both be "high" indicating that the transistors of the circuit exhibit "high" conductivity. If D and DA are "high" during the first sampling interval and "low" during the second sampling interval, the output Q1 of flip flop 142 will be "high" and the output Q2 of flip flop 162 will be "low" indicating that the transistors of the circuit exhibit "nominal" conductivity. If D and DA are low during the first and second sampling intervals, the outputs Q1 and Q2 will both be "low" indicating that the transistors of the circuit exhibit "low" conductivity. The sampling intervals are generated by means of a first and a second delay network, 18 and 20, respectively, driven by a clock signal O1 derived from the clock input.

Figure 2:
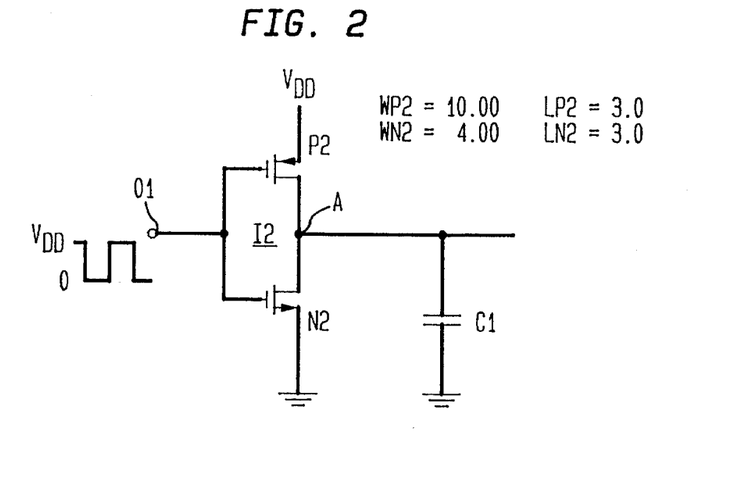
FIG. 2 is a schematic diagram of an integrator network suitable for use in circuits embodying the invention.

The operation of the circuit of FIG. 1 will now be discussed in detail with reference to FIGS. 2, 3, 4 and 5. Referring to FIG. 2, the integrator circuit 10 includes a complementary inverter I2 having its input connected to node O1 and its output connected to node A. Inverter I2 includes a P-type insulated-gate field-effect transistor (IGFET) P2, having its conduction path connected between VDD and terminal A and an N-type IGFET, N2, having its conduction path connected between terminal A and ground. The gates of P2 and N2 are connected to terminal O1 and the drains of P2 and N2 are connected to terminal A. [In FIG. 2 and in the other detailed schematics, the invention is illustrated using IGFETS. Each IGFET has a source and a drain electrode defining the ends of the conduction path of the IGFET and a control electrode (gate) which overlies the conduction path.]

When the signal at O1 goes from VDD to ground, N2 is turned-off and P2 is turned-on. P2 then provides a conduction path to charge capacitor C1 and node A towards VDD, as shown for time t1 to t2 in waveform A of FIG. 4. The rate at which node A charges towards VDD is a function of the conductivity of P2. In the discussion to follow, the conductivity of a transistor (which is a measure of its ability to produce or pass a current) will be considered as the inverse of the equivalent impedance of the transistor. When discussing the conductivity or the equivalent impedance of an IGFET, what is meant is the conductivity or impedance of the source-to-drain path of the IGFET. Thus, for example, if the equivalent impedance (ZP1) of P2 is high (its conductivity is low) the output of integrator 10 will follow the waveform A1 and have an amplitude of V1 at time t2. If ZP1 has a somewhat lower value, the output at A will follow the waveform A2 and have a value of V2 at time t2. If ZP1 has a still lower value (its conductivity is higher) the output at node A will follow the waveform A3 and have a value of V3 at time t2. Thus, depending on the value of ZP1, the output of the integrator may range between a value corresponding to V1 and one corresponding to V3.

When the control or clock signal at O1 goes from ground to VDD at time t2, P2 is turned-off and N2 is turned-on. The turn-on of N2 causes the discharge of node A towards ground from time t2 to t3, as shown in waveform A of FIG. 4. The rate of discharge is a function of the conductivity ( i.e., the inverse of the equivalent impedance) of N2. For ease of explanation it will be assumed that the conductivity and the equivalent impedance of N2 is similar to that of P2 and varies in a similar manner whereby at time t3 node A will be discharged to, or close to, the level it had at time t1. [In practice, node A may not be fully discharged at the end of each cycle in which event the potential at node A would vary about an average dc (direct current) level, as shown in waveform A of FIG. 4A. Correspondingly, the signal at node B would also be shifted as shown in waveform B of FIG. 4A.]

It should be noted that the conductivity and equivalent impedance of P2 and N2 is a function (among others) of variations in processing, applied operating potential, and temperature. Thus the amplitude of the signal at node A at time t2 is indicative of whether transistor P2 (and N2) has a high conductivity (low equivalent impedance), a low conductivity (high equivalent impedance), or a nominal conductivity (nominal impedance) which lies somewhere between the high and low values. When a transistor has a "high" conductivity it charges or discharges a node more quickly and hence it will be referred to as being "fast" [and the process producing such transistors may also be referred to as being "fast"]. When a transistor has a "low" conductivity it charges or discharges a node more slowly and hence is referred to as being "slow" [and the process producing such a transistor may be referred to as a "slow" process]. A transistor whose conductivity lies between the "high" and "low" conductivity range will be referred to as having a "nominal" conductivity [and the process producing these transistors is also being termed "nominal"].

Note that transistors P2 and N2 are assumed to be typical of the other transistors formed at the same time and by the same process, on the same integrated circuit and subjected to the same operating potential and temperature variations. Thus, the response of P2 and N2 is reflective of the response of the other transistors formed on the IC.

Figure 3:
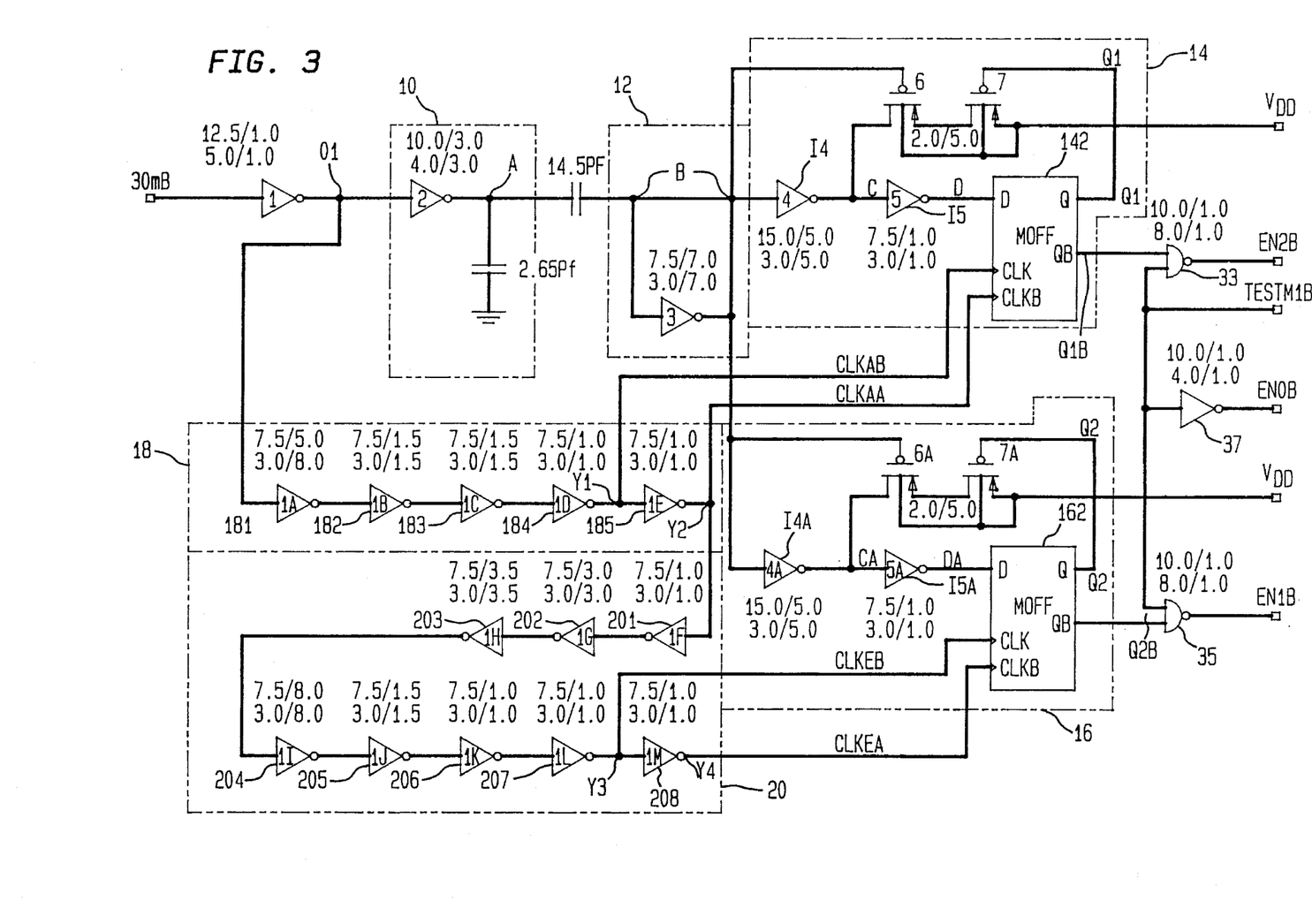
FIG. 3 is a more detailed schematic diagram of a circuit embodying the invention.

Referring to FIG. 3, note that all the inverters are complementary inverters comprising a P channel and an N channel insulated-gate-field-effect transistor (IGFET). In FIG. 3, associated with each inverter symbol are two sets of numbers. The upper set identifies the width to length ratio of the P type transistor and the lower set the width to length ratio of the N type transistor. Due to the different mobilities of the P and N type transistors, the W/L ratio of the P type transistors have to be approximately 2.5 times the W/L ratio of N type transistors to produce equal impedances (and a threshhold of VDD/2).

Referring to FIG. 3 the triangular waveform produced at output A of integrator 10 (shown in waveform A of FIG. 4 or FIG. 4A) is AC coupled via capacitor C2 to the input of a self biased amplifier 12. In the embodiment shown in FIG. 3, amplifier 12 consists of a complementary inverter I3 powered between VDD and ground and whose signal output is shorted to its signal input. So connected, I3 functions to establish a DC level at node B which may be assumed to be equal to VT0. Where the equivalent impedance of the P and N IGFETs forming I3 are equal to each other, VT0 will be nearly equal to VDD/2. The DC average potential at (B) is established by the self-biased inverting amplifier 12. The AC amplitude at (B) is equal to the AC amplitude of the output (A) of network 10. Each one of networks 14 and 16 senses the combined potential level at (B). The triangular waveform produced at node A (shown in waveform A of FIG. 4 or 4A) is coupled to node B at which is produced a corresponding waveform which varies about VT0 as shown in waveform B of FIG. 4 or 4A. The average DC value at node B determined by inverter I3 is equal to VT0 which defines the logic threshold of inverter I3.

As shown in FIG. 3, node B is coupled to the inputs of complementary inverters I4 and I4A in networks 14 and 16, respectively. The P and N type IGFETS forming inverter I4 (and I4A) are ratioed such that the threshold voltage (VT1) of I4 and I4A is higher (more positive) than that (VT0) of I3. This is accomplished by making the impedance of the N type IGFET greater than the impedance of the P type IGFET. The portion of the signal at node B which lies above VT1 gets narrower as the process is slower, and gets wider as the process gets faster, as illustrated by the period for which A1, A2 and A3 extend above VT1 in waveform B of FIGS. 4 and 4A. Whenever the signal at node B is more positive than VT1, inverters I4 and I4A produce "low" signals at node C and CA, respectively. The outputs C and CA of inverters I4 and I4A, respectively, are applied to the inputs of inverters I5 and I5A, respectively, which produce at their outputs, nodes D and DA, respectively, signals which are the inverse of the signals at node C (and CA) and which have relatively sharp edges as shown for waveforms D/DA in FIG. 4. Inverters I4A and I5A shown in Block 16 of FIG. 3 are identical to, and function identically to, I4 and I5 in Block 14 and need not be further detailed.

Figure 4:
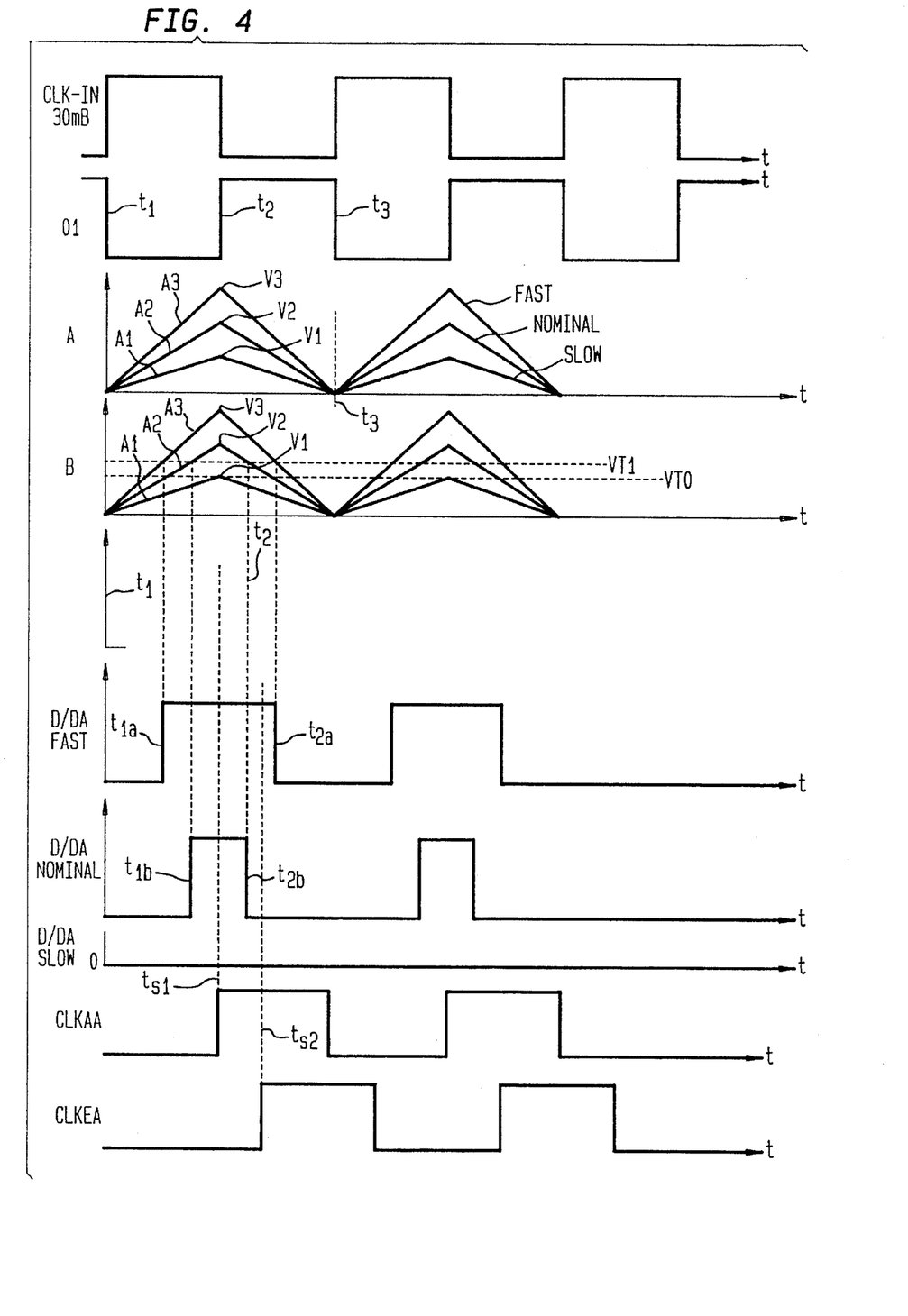
FIG. 4 is a diagram of idealized waveforms at certain points of the circuit of FIGS. 1 and 3.
Figure 4A:
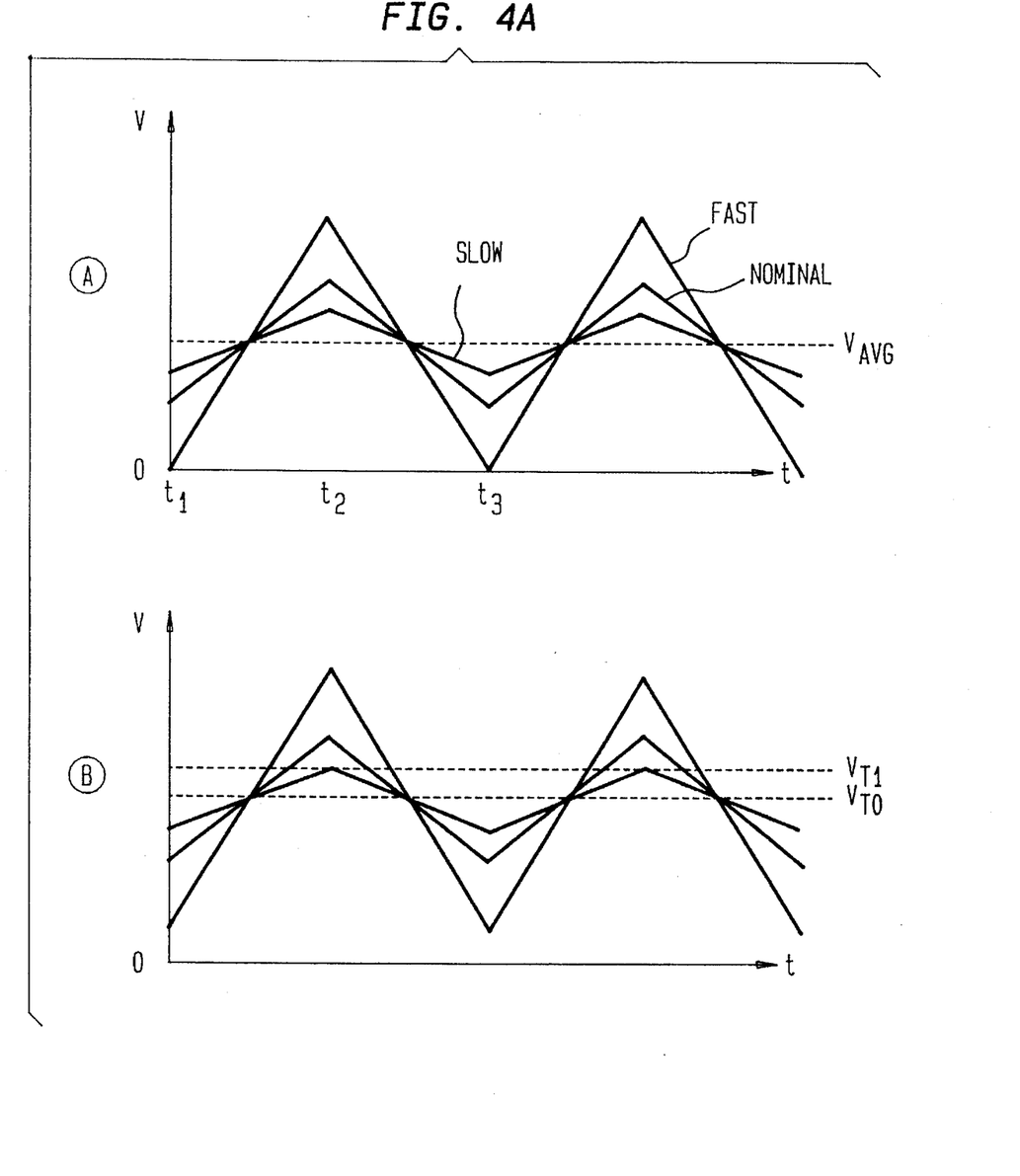
FIG. 4A is a diagram of typical waveforms produced at nodes A and B under actual operating conditions.

Depending on the conductivity of transistors P2 and N2 in integrator 10, the signal D (or DA) produced at node D (or DA) may vary dramatically as depicted in the waveforms shown for "D/DA fast" to those shown for "D/DA slow" in FIG. 4. Note that signals D and DA will be identical, will be in phase with the signal at B and will be "high" for the length of time that the signal at B exceeds VT1. The signal produced at D is transferred to Q1 on the rising edge of clock AB and the signal DA is transfered to Q2 on the rising edge of clock EB. FIG. 1 shows that the input clock (30 MB) is applied to a first delay network 18 to produce a delayed clock AA and a delayed and inverted clock AB. Clock AA is then applied to a second delay network 20 to produce a delayed clock EA and a delayed and inverted clock EB. Circuitry to implement the first and second delay network is detailed in FIG. 3. Four complementary inverters 181, 182, 183 and 184 are connected in cascade between the output of inverter I1 and a node Y1 to produce clock AB. A complementary inverter 185 is connected between nodes Y1 and Y2 to produce clock AA, as shown in FIG. 4. Seven complementary inverters 201 to 207 are connected in cascade between the output of inverter 185 and a node Y3 to produce the clock EB. A complementary inverter 208 is connected between nodes Y3 and Y4 to produce the clock EA, shown in FIG. 4. Clock AB and its complement Clock AA are applied to flip flop 142 while clock EB and its complement clock EA are applied to flip flop 162. Clock signals AA and AB are designed to sample the value of D at a time close to t2 when it would have its maximum value and clocks EA and EB are designed to sample the signal DA a short time after t2 to determine how long the signals D/DA remain high.

For the condition of "low" conductivity, the triangular waveform at node B hardly reaches VT1. As a result the signal at node C is held "high" and the signal at D/DA is held "low" whereby Q1 and Q2 remain "low" throughout the cycle.

For the condition of "nominal" conductivity, the signal at node B rises above VT1 for a short period of time t1b to t2b during which period a positive going pulse is produced at nodes D/DA as shown for waveform B in FIG. 4. The signal at node C goes low and the signal at D goes high for the same period (t1b to t2b) of time, as shown for waveform "D/DA nominal" in FIG. 4. Therefore Q1 is high and Q2 is low for transistors exhibiting nominal conductivity.

For high conductivity transistors the signal at node B stays more positive than VT1 for a longer period of time than in the nominal case as shown for time t1a to t2a in waveforms B and "D/DA fast" of FIG. 4. The signal at node C goes low and the signal at D goes high for a longer period of time (i.e. t1a to t2a) than in the nominal case. For this signal condition, clock AA catches D and clock EA catches DA when they are both "high". As a result, Q1 and Q2 will both be set high for transistors exhibiting high conductivity characteristics.

Figure 5A:
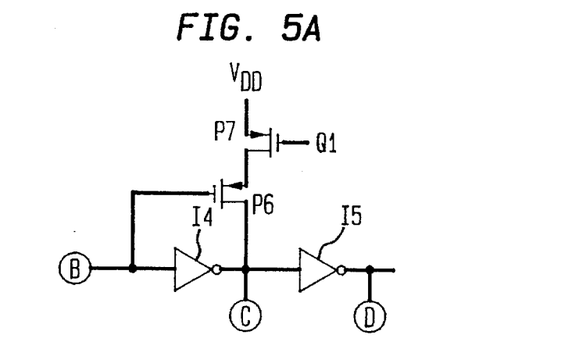
FIGS. 5A and 5B are schematic diagrams of an hysteresis circuit suitable for use with circuits embodying the invention.
Figure 5B:
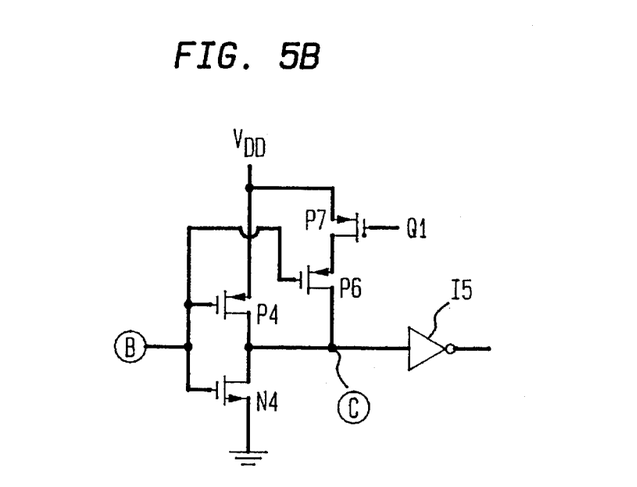

To provide operation in which noise conditions are reduced, a network comprised of IGFETs P6 and P7 is combined with inverter I4 as shown in detail in FIGS. 5A and 5B to provide hysteresis. As shown in FIG. 5B, inverter I4 includes IGFETS P4 and N4 having their conduction paths connected in series between VDD and ground. The conduction paths of P-type IGFETS P6 and P7 are connected in series between VDD and node C to which are also connected the drains of P4 and N4. Hence, the conduction path of P4 is connected in parallel with the series connected conduction paths of P6 and P7. The gate of P7 is connected to Q1 and the gate of P6 is connected to node B. When Q1 is low, P7 is switched on and the series connected conduction paths of P6 and P7 are connected in parallel with P4. This functions to decrease the effective impedance of the P-portion of the inverter I4 (P4 with P6 and P7) relative to the N-type portion (N4) of inverter I4. As a result, the threshold voltage, VT1, of the inverter is shifted to a higher value (i.e. the input has to rise to a higher value to cause the output I4 to go low). When Q1 goes high P7 is turned off and P6 and P7 are effectively removed from the circuit in which case VT1 is lowered (and smaller values of signal will cause the output C of I4 to remain low and D to be high). This circuit arrangement provides hysteresis to the setting of VT1 whereby small noise levels coupled into the circuit do not cause Q1 (or Q2) to flicker on and off. A similar hysteresis circuit is designed into network 16 as shown in FIG. 3 with IGFETs P6A and P7A coupled to inverter I4A.

It has thus been shown that the value of the outputs Q1 and Q2 indicate the degree of conductivity and speed of response of the transistors formed on the IC. It will now be shown that the outputs Q1 and Q2 may be used to control the response of a circuit such as the driver circuit shown in FIG. 6.

Figure 6:
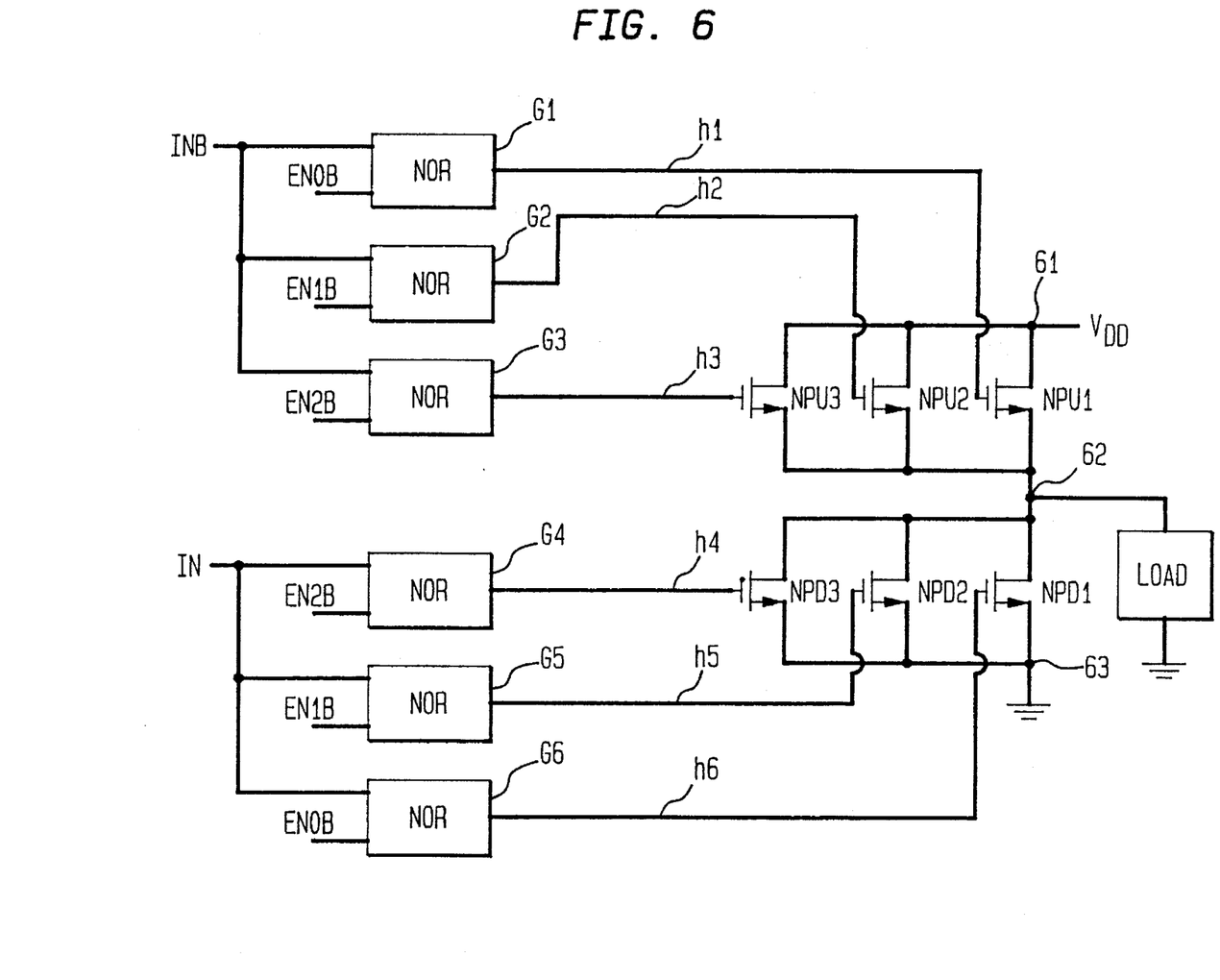
FIG. 6 is a semi-block semi-schematic diagram of a driver circuit embodying the invention.

To operate the circuit of FIG. 6, Q1 and Q2 are combined to produce 3 logic signals [EN0B, EN1B and EN2B] on 3 different and separate lines. Referring to FIG. 3, note that Q1B is applied to one input of a two-input NAND gate 33 and Q2B is applied to one input of a two-input NAND gate 35. A TESTM1B signal is applied to the other input of NAND gates 33 and 35 and to the input of an inverter 37. The output of inverter 37 produces the signal EN0B. The output of NAND gate 33 produces the output EN2B and the output of NAND gate 35 produces the output EN1B. TESTM1B is a test signal which is Low during test mode and High during normal operation. During the test mode (TESTM1B is Low), EN0B, EN1B and EN2B are all high and all the output drivers are disabled (tri-stated). During normal operation, TESTM1B is High which causes at least EN0B to be Low, which in turn causes at least one driver transistor (NPU1 or NPD1) to be always enabled during normal operation. This corresponds to the "FAST" case. If Q2 is Low (Q2B is High), the response of the transistors on the IC is in the "nominal" range. For this condition, EN1B is driven Low which causes the turn-on of a second driver transistor (NPU2 or NPD2) in parallel with the first driver transistor NPU1 or NPD1. If Q1 is Low (Q1B is High), the response of the transistors on the IC is "slow". For this condition, EN2B goes Low to enable a third driver transistor (NPU3 or NPD3) to be turned-on in parallel with NPU1, NPU2 or NPD1, NPD3. If Q2 is Low, Q1 may be High or Low. But if Q1 is Low, Q2 must also be Low (because of the delay structures).

The output driver circuit of FIG. 6 includes three pull-up transistors of N-conductivity type (NPU1, NPU2, NPU3) having their conduction paths connected in parallel between a power terminal 61 to which is applied VDD volts and output terminal 62 to which is connected a load to be driven. The gate electrode of NPU1 is connected to the output of a two-input NOR gate G1; the gate electrode of NPU2 is connected to the output of a two-input NOR gate G2; and the gate electrode of NPU3 is connected to the output of a two-input NOR gate G3. A signal EN0B is applied to one input of gate G1; a signal EN1B is applied to one input of gate G2; and a signal EN2B is applied to one input of gate G3. A signal INB is applied to the other input of gates G1, G2 and G3.

The output driver circuit of FIG. 6 also includes three pull-down transistors of N-conductivity type (NPD1, NPD2, NPD3) having their conduction paths connected in parallel between output terminal 62 and ground terminal 63. The gate electrode of NPD1 is connected to the output of a two-input NOR gate G6; the gate electrode of NPD2 is connected to the output of a two-input NOR gate G5; and the gate electrode of NPD3 is connected to the output of a two-input NOR gate G4. A signal EN2B is applied to one input of gate G4; a signal EN1B is applied to one input of gate G5; and a signal EN0B is applied to one input of gate G6. A signal IN is applied to the other input of gates G4, G5 and G6. IN and INB are complementary signals (i.e. they are of opposite polarity), whereby either the pull-up transistors are turned-on or the pull-down transistors are turned-on.

The INB signal controls whether the pull-up circuit is turned on or off. When INB is low (i.e. IN is high), the NOR gates G1, G2 and G3 are primed and their respective outputs will be high or low as a function of the input signals EN0B, EN1B, and EN2B. When EN0B and INB are low, the output, h1, of G1 is high and NPU1 is turned-on. When EN1B and INB are low the output, h2, of G2 is high and NPU2 is turned on. When EN2B and INB are low the output, h3, of G3 is high and NPU3 is turned on. When INB is high all the h1, h2 and h3 outputs are low regardless of the logic states of EN0B, EN1B and EN2B.

The IN signal controls whether the pull-down circuit is turned on or off. When IN is low (i.e. INB is high), the NOR gates G4, G5 and G6 are primed and their respective outputs will be high or low as a function of the input signals EN0B, EN1B, and EN2B. When EN2B and IN are low, the output, h4, of G4 is high and NPD3 is turned-on. When EN1B and IN are low, the output h5, of G5 is high and NPD2 is turned on. When EN0B and IN are low, the output h6 of G6 is high and NPD1 is turned on. When IN is high all the h4, h5 and h6 outputs are low regardless of the logic states of EN0B, EN1B and EN2B.

The operation of the circuit of FIG. 6 is described below:

1. For the condition when the speed of response of the transistors on the integrated circuit is "fast", Q1 and Q2 are high. As discussed above, the "fast" condition results from the combination of the process being fast, the applied operating potential being high and the temperature being low. For the "fast" condition, only one transistor (NPU1 or NPD1) of the three transistors in each set of parallel connected driver transistors is turned on when a pull-up or pull down signal is generated.

2. For the condition when the speed of response of the transistors of the IC is "nominal", Q1 is high and Q2 is low. For this condition, two transistors (NPU1 and NPU2; or NPD1 and NPD2) of the three transistors in each set of parallel connected driver transistors get turned on when a pull-up or pull-down signal is generated.

3. For the condition when the speed of response of the transistors on the integrated circuit is "slow", Q1 and Q2 are low. For this condition, the process is "slow", the operating potential is low and the temperature is high. For the slow condition, the three transistors (NPU1, NPU2 and NPU3; or NPD1, NPD2 and NPD3) in each set get turned on in response to a pull-up or pull-down signal.

Figure 7:
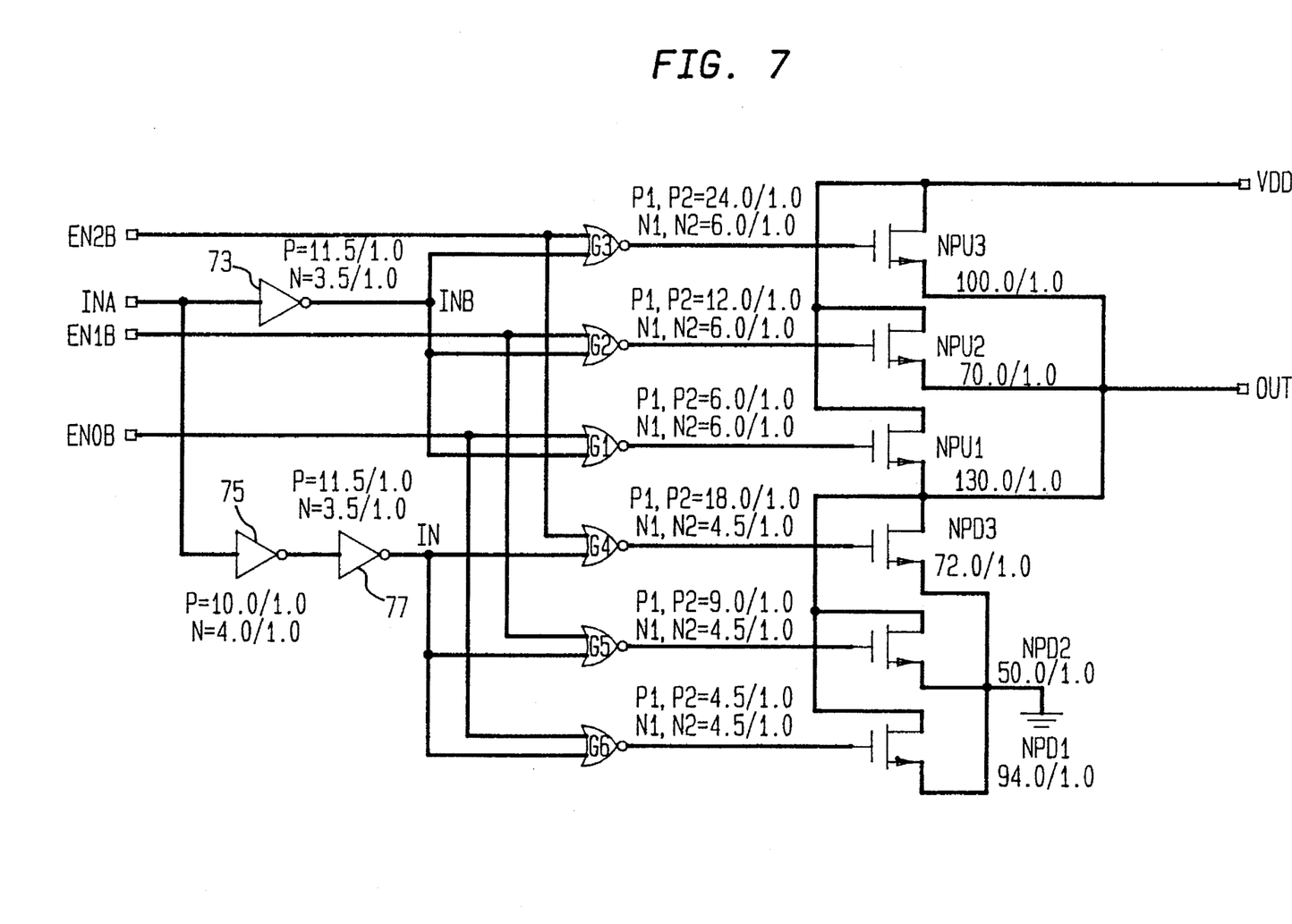
FIG. 7 is a detailed schematic diagram of an output driver circuit embodying the invention.

A preferred output driver embodying the invention is shown in FIG. 7. NOR gates G1 through G6 are complementary metal oxide semiconductor (CMOS) circuits. Associated with each NOR gate shown in FIG. 7 are two sets of numbers. The upper set defines the W/L ratio of the P-type transistors and the lower set defines the W/L ratio of the N-type transistors. Associated with the pull-up and pull-down transistors is a set of numbers defining the W/L ratio of each transistor. A signal INA is applied to the input of an inverter 73 to produce a signal INB (which corresponds to INB of FIG. 6) and to inverters 75 and 77 to produce a signal IN (which corresponds to IN of FIG. 6). Obviously, IN and INB will always be of opposite polarity (complementary).

When two or more of the three transistors connected in parallel in the pull-up or pull-down circuit are enabled, they do not all turn on at the same time. The transistors connected in parallel are turned on one at a time and there is a small delay between the turn on of one driver transistor and the turn on of another driver transistor. As noted above, when INB is high (IN is low), the pull-up transistors are disabled. When INB is low (IN is high), the signal condition of EN0B, EN1B and EN2B controls which ones of the pull-up driver transistors get turned-on. Similarly, when IN is high (INB is low), the pull-down transistors are disabled. When IN is low (INB is high), the signal condition of EN0B, EN1B and EN2B controls which ones of the pull-down transistors get turned-on. Thus, when EN0B, EN1B and EN2B are high, they disable their corresponding transistors and do not let the input signals IN and INB through, by driving the outputs of the corresponding NOR gates low no matter what logic states IN and INB are in.

The driver transistors (NPU1 or NPD1) which are always enabled during normal operation, are the largest transistors. The driver transistors (NPU2 or NPD2) which are enabled for the "nominal" condition by EN1B, are half as big as driver transistors NPU1 or NPD1, so that their turn-on adds approximately 50% more current drive. The driver transistors (NPU3 and NPD3) which are enabled by EN2B when the device response is slowest, are half as big as the first two driver transistors combined together, so that their turn-on adds 50% more current drive to the already existing drive. In short, as shown in FIG. 7, NPU3 is half as big as NPU1 and NPU2 combined together, and NPD3 is half as big as NPD1 and NPD2 combined together. The additional parallel driver transistors which are needed when the process is slow and the transistors respond sluggishly, are switched in at an increasingly faster rate. In essence, the fast switching driver transistors (NPU2, NPU3 or NPD2, NPD3) are enabled only when the response of the transistors on the IC is slow.

Referring to FIG. 7, it may be deduced from the size of the transistors forming the NOR gates, that the driver transistors, NPU1 or NPD1, which are always enabled during normal operation, are driven by the smallest (and therefore slowest) NOR gates, G1 and G6, respectively. The second driver transistors, NPU2 and NPD2, are driven by larger (and therefore faster) NOR gates, G2 and G5, respectively. The last driver transistors, NPU3 or NPD3, enabled by EN2B when the device response is slowest, are driven by the largest (and fastest) NOR gates, G3 and G4, respectively. Consequently, NPU1 is the slowest pull-up device to turn-on. NPU2 (when enabled) turns-on faster than NPU1 and NPU3 (when enabled) turns-on the fastest. Similarly, NPD1 is the slowest pull-down device to turn-on, NPD2 turns-on faster (when enabled), and NPD3 turns-on the fastest (when enabled).

Thus, as the device response becomes slower due to a slow process, a low power supply, a high temperature, or a combination thereof, additional driver transistors are enabled to provide more current drive as needed, and these newly added transistors have the capability of turning-on at a faster rate than the already enabled transistors. This way, even where more than one driver transistor is enabled, there is a small delay between their turning-on, and this helps to alleviate the glitch on the supply line or ground line.

To further enhance this successive switching feature, the integrated circuit is physically laid out in such a way to ensure that the physical distance between G1 and NPU1 is the largest, compared to the physical distance between G2 and NPU2 (second largest), and the physical distance between G3 and NPU3 (shortest). This is to make sure that the signal h1 arrives at the gate NPU1 only after h3 has reached the gate of NPU3 (first) and h2 has reached the gate of NPU2 (second). Similarly, the physical distance between G6 and NPD1 is the longest, compared to the physical distance between G5 and NPD2 (second longest), and the physical distance between G4 and NPD3 (shortest), so that the signal h6 arrives at the gate of NPD1 only after h4 has reached the gate of NPD3 (first) and h5 has reached the gate of NPD2 (second).

All the pull-up and pull-down transistors in the circuit of FIGS. 6 and 7 are of N-conductivity type to provide a smaller voltage swing at the output. That is, when any pull-up transistor is turned-on and a voltage of VDD volts is applied to its gate, the voltage at its source will be VDD-VT; where Vt is equal to the threshhold voltage of the transistor. This also ensures that the glitches will be smaller and that there will be less power dissipation. As a consequence of using transistors of one conductivity type, the pull-up transistors operate in the low-gain source follower mode while the pull-down transistors operate in the common-source mode. Complementary signals are applied to the gates of the pull-up and pull-down transistors to ensure that when a pull-up transistor is turned on no pull down transistor is turned on and vice-versa.

For the reasons discussed above, the same conductivity type transistors were used to form the driver circuit shown in FIGS. 6 and 7. However it should be appreciated that transistors of complementary conductivity (P and N) type could be used to form a driver circuit. The P and N could be connected to either conduct in the common-source mode, or in the source follower mode. In the common source mode, there would be more voltage swing and faster operation. In the source follower mode, there would be a VT drop for both pull-up and pull-down. [The driving circuit (NOR gates G1–G6) will have to be modified to ensure proper polarities for the different types of conductivity.]

In FIGS. 6 and 7, the driver circuits include three transistors connected in parallel with the number of transistors enabled at any time being a function of the conductivity of the transistors. It should be appreciated that the driver circuit could include a single pull-up and a single pull-down transistor with different control voltage levels applied to the gates of the transistors to cause their conductivity to vary as a function of the speed of response of the transistors on the integrated circuit.

It should also be appreciated that more than two sampling networks and more than two sampling intervals could be included in the transistor characteristic sensor design which could then be used to produce more than three output signals which could in turn control the enabling of more than three driver transistors connected in parallel or the gate voltage of a single pull-up and a single pull-down transistor.

In the circuit of FIGS. 1 and 3, networks 14 and 16 were designed to sense the length of time a signal was above a predetermined threshhold level. It should be appreciated that voltage comparators could be connected to node A or node B to sense the amplitude of the signal at the node at a given time (e.g. t2) and the voltage comparators could then provide a signal indicative of the amplitude and hence of the speed of response of the transistors of the circuit.

The invention has been illustrated with insulated-gate field-effect transistors. However, it should be appreciated that bipolar transistors could also be used to practice the invention.

What is claimed is:

1. In an integrated circuit (IC) comprising a plurality of transistors, each transistor having a conduction path and a control electrode, wherein each transistor is designed to exhibit a particular degree of conductivity, or equivalent impedance, along its conduction path for a given turn-on voltage applied to its control electrode, and wherein the actual degree of conductivity, or equivalent impedance, of the conduction path of each transistor of the IC may be different than its designed value due to processing variations, temperature variations and different operating potentials applied across the transistor, the improvement comprising:

integrating means including the conduction path of a selected one of said transistors of the IC for producing an analog control voltage whose amplitude is proportional to, and indicative of, the value of the actual equivalent impedance of the conduction path of the selected transistor; and means, responsive to the amplitude of the analog control voltage, coupled to other transistors of the IC for controlling their equivalent impedance and rendering their equivalent impedance more uniform in conformance with their design value under different operating conditions.

2. In an IC as claimed in claim 1 wherein, in response to said selected transistor exhibiting a high degree of conductivity or low equivalent impedance, said means controlling the equivalent impedances of said other transistors of the IC increases their equivalent impedances; and wherein, in response to said selected transistor exhibiting a low degree of conductivity or high equivalent impedance, said means controlling the equivalent impedances of said other transistors of the IC decreases their equivalent impedances.

3. In the integrated circuit as claimed in claim 1 wherein said other transistors of said IC include a plurality of insulated gate field effect transistors (IGFETs), each IGFET having first and second electrodes defining the ends of a conduction path and a control electrode;

wherein a first group of said IGFETs have their conduction paths connected in parallel between a first power terminal and an output terminal for forming a first load driving network;

wherein a second group of said IGFETs have their conduction paths connected between said output terminal and a second power terminal for forming a second load driving network; and wherein said means responsive to the control voltage includes means for applying a signal to said first and second load driving networks for controlling the number of transistors which are enabled in said networks so as to decrease the equivalent impedance of the first and second driving networks when the actual equivalent impedance of said selected transistor is high and so as to increase their equivalent impedance when the actual equivalent impedance of said selected transistor is low.

4. In the IC as claimed in claim 1 wherein said integrating means includes:

an integrator network comprising the conduction path of said selected transistor and a capacitor, and including means for biasing the selected transistor into conduction during a first, charging, period of time and charging the capacitor from a voltage V2 towards a voltage V1 for developing a voltage (Vc) across said capacitor during said first period whose amplitude is a function of, and proportional to, the degree of conductivity of the conduction path of said selected transistor; the value of the capacitor and the duration of said first period being selected such that, at the end of said first period, the amplitude of Vc is normally less than V1 and ranges between V2 and V1 whereby the amplitude of Vc is closer to V2 for a selected transistor of low conductivity and is closer to V1 for a selected transistor of greater conductivity;

means for discharging said capacitor towards V2 during a second, discharging, period; and wherein said means responsive to the control voltage includes means for sensing the amplitude of Vc, where Vc is the voltage developed across the capacitor, and for producing a control signal responsive to Vc.

5. In the integrated circuit as claimed in claim 4 wherein said means for sensing the amplitude of Vc includes means for sensing said amplitude and the length of time the amplitude is above a predetermined level, the length of time the amplitude is above a predetermined level being indicative of the conductivity of the selected transistors and of the transistors of the integrated circuit.

6. In the integrated circuit as claimed in claim 5, wherein said selected transistor is a first insulated gate field-effect transistor (IGFET) having source and drain electrodes defining the ends of a conduction path and a control electrode for controlling its conductivity; wherein the conduction path of the selected transistor is connected between a first power terminal and one side of the capacitor; and wherein the other side of said capacitor is fixedly connected to a second power terminal.

7. In the integrated circuit as claimed in claim 6, wherein said means for sensing the amplitude of the signal developed across said capacitor includes means for sensing the length of time the amplitude of the signal developed across the capacitor is above a given threshold and for producing a digital signal having one binary value when the amplitude is above the given threshold for a period of time and for producing a digital signal having the other binary value when the amplitude is below the given threshold for the preset period of time.

8. In the integrated circuit as claimed in claim 7, wherein said means for sensing the amplitude of the signal developed across said capacitor includes means for sampling the length of time the digital signal has a given binary value and for producing signals indicative of the length of time the digital signal has a given binary value.

9. In the integrated circuit as claimed in claim 6, wherein said means for discharging said capacitor includes a second IGFET of opposite conductivity type to the conductivity of said first IGFET, and wherein said second IGFET has its conduction path connected across said capacitor, and wherein said first IGFET is turned-on and said second IGFET is turned-off for said first period of time to charge said capacitor and said first IGFET is turned-off and said second IGFET is subsequently turned-on for said second period; said first and second IGFETs being turned on and off alternatively and successively for charging and discharging said capacitor.

10. In the IC as claimed in claim 9 wherein said means for turning said first and second IGFETs on and off include a continuous clock signal applied to the control electrodes of said first and second IGFETs for alternatively turning said first and second IGFETs on and off, respectively.

11. In the integrated circuit as claimed in claim 9, wherein said one side of said capacitor defines an output of the integrator network; and wherein said means for sensing the amplitude of the voltage across the capacitor includes a self biased amplifier and means for alternating current (AC) coupling the self biased amplifier to the output of the integrator.

12. In the IC as claimed in claim 11 wherein said self biased amplifier includes at least one inverter and means for applying a low impedance connection between the input and the output of said at least one inverter.

13. In the integrated circuit as claimed in claim 11 wherein said self biased amplifier includes means for setting its threshold voltage at a given threshold value, VT0, which is greater than V2 and less than V1.

14. In the integrated circuit as claimed in claim 13 wherein said self biased amplifier has an output and wherein said means for sensing the amplitude includes a second amplifying stage having an input and an output, the input of said second amplifying stage being connected to the output of said self biased amplifier; and said second amplifying stage having a second threshold value (VT1) other than said given threshold value (VT0).

15. In the integrated circuit as claimed in claim 14 wherein said second amplifying stage includes means for providing hysteresis to said second amplifying stage.

16. In the integrated circuit as claimed in claim 14 wherein said second amplifying stage produces at its output a digital signal having one binary value when the signal at its input is more positive than said second threshold value and the other binary value when the signal at its input is less positive than said second threshold value.

17. In the IC as claimed in claim 16 wherein the binary signals produced at the output of said second amplifying stage are stored in a flip-flop.

18. In an integrated circuit (IC) having a plurality of transistors, each transistor having first and second electrodes defining the ends of a conduction path and a control electrode, and wherein the conduction path of each transistor is desired to exhibit a certain degree of conductivity or equivalent impedance for a given turn-on voltage applied between its control and first electrodes; and wherein the value of the actual equivalent impedance may be different than the desired equivalent impedance due to variations in processing or temperature or operating voltage, the improvement comprising:

circuit means for measuring the equivalent impedance of selected transistors of the IC and for producing an analog control signal whose amplitude is proportional to, and indicative of, the actual equivalent impedance of said selected transistors of the IC; and means, responsive to the control signal, coupled to other transistors of the IC for controlling their equivalent impedance and rendering their response more uniform thereby compensating for the difference between the actual equivalent impedance of these transistors and their desired values.

19. The integrated circuit of claim 18 wherein said circuit means includes an integrating network comprising:

a) a capacitor formed on said IC;

b) first and second transistors selected from said plurality of transistors, defining the selected transistors whose equivalent impedance is to be measured;

c) means connecting one end of the conduction paths of said first and second transistors to one side of said capacitor;

d) means for applying a first fixed potential (V1) to the other end of the conduction path of said first transistor and a second fixed potential (V2) to the other side of said capacitor;

e) means for applying a known turn-on voltage to the control electrode of said first transistor for a first time period for turning on said first transistor and charging said capacitor during said first time period for developing a voltage across said capacitor during said first period of time whose amplitude is a function of, and proportional to, the conductivity of said first transistor; and f) means for applying a known turn-on voltage to the control electrode of the second transistor for a second time period for discharging said capacitor during said second time period subsequent to said first time period; and means for sensing the amplitude of the voltage developed across the capacitor at selected times during the interval defined by said first and second time periods for producing control signals corresponding to the amplitude of the voltage across said capacitor, where the amplitude is indicative of, and proportional to, the degree of conductivity of the conduction paths of said first and second transistors, and for applying said control signals to said other transistors of the IC for controlling their equivalent impedance.

20. In an integrated circuit (IC) as claimed in claim 18, wherein said plurality of transistors are insulated gate field effect transistors (IGFETs);

wherein said circuit means comprises an integrating circuit including:

a) first and second IGFETs selected from said plurality of IGFETs; each IGFET having first and second electrodes defining the ends of a conduction path and a control electrode;

b) first and second power terminals;

c) a capacitor formed on said IC;

d) means connecting the conduction path of said first IGFET between said first power terminal and one side of said capacitor;

e) means fixedly connecting the other side of said capacitor to said second power terminal;

f) means connecting the conduction path of said second IGFET across said capacitor;

g) means for applying a fixed known operating potential across said first and second power terminals;

h) means for applying a known potential to the control electrodes of the first and second IGFETs for alternatively turning-on said first IGFET and turning-off said second IGFET and then turning-off said first IGFET and turning-on second IGFET for alternatively charging and discharging said capacitor and for generating a voltage across said capacitor whose amplitude is a function of, and proportional to, the equivalent impedance of the conduction paths of said first and second IGFETs; and wherein said means responsive to the control signal includes means for sensing the amplitude of the voltage across the capacitor and producing a further control signal indicative of the degree of conductivity of the conduction paths of the transistors of the IC and for applying said further control signal to at least one of said plurality of IGFETs for controlling the equivalent impedance of its conduction path, when it is turned-on.

21. The IC as claimed in claim 20 wherein said first and second IGFETs are of complementary conductivity type.

22. The IC as claimed in claim 21, further including a utilization circuit having an input and an output terminal at which is connected a load; and means for applying said further control signal to said utilization circuit for controlling its equivalent impedance and drive to said load as a function of the equivalent impedance of the selected transistors of the IC.

23. The IC as claimed in claim 22 wherein said utilization circuit is a load driver having a first set of "M" transistors having their conduction paths connected in parallel between said first power terminal and said output terminal, and a second set of "M" transistors having their conduction paths connected in parallel between said output terminal and said second power terminal, where "M" is an integer greater than 1; and wherein said means for applying said control signal to said utilization circuit includes means for applying said control signal to the control electrodes of the first and second set of "M" transistors connected in parallel to determine how many of these transistors are to be enabled as a function of the conductivity of the transistors of the IC.

24. The IC as claimed in claim 23, wherein how many of said "M" transistors are connected in parallel, at any time, is a function of the conductivity of the selected transistors; and wherein the enabling of said "M" transistors is dynamically and continuously controlled.

25. An integrated circuit (IC) comprising:

first and second power terminals for the application therebetween of an operating potential;

an output terminal;

a multiplicity of insulated gate field effect transistors (IGFETs) formed on said IC, each IGFET having source and drain electrodes defining the ends of a conduction path and a control electrode for controlling its turn-on and turn-off, each IGFET designed to have a characteristic degree of conductivity for a given turn-on voltage;

a first plurality of said IGFETs having their conduction paths connected in parallel between said first power terminal and said output terminal;

a second plurality of said IGFETs having their conduction paths connected in parallel between said output terminal and said second power terminal;

means coupled to selected transistors of said IC for sensing the actual degree of conductivity of the conduction paths of said selected transistors and for producing a control signal whose amplitude is indicative of the degree of conductivity of these selected transistors, where the selected transistors are other than those included in the first and second plurality of said IGFETs; and control means, responsive to the amplitude of the control signal indicative of the conductivity of said selected transistors of said IC, coupled to the control electrodes of said first plurality of IGFETs and to the control electrodes of said second plurality of IGFETs for turning on more of said first and second plurality of IGFETs in parallel when the degree of conductivity of the conduction paths of said selected transistors of the IC is below a given level and for turning-on fewer of said first and second plurality of IGFETs in parallel when the degree of conductivity of the conduction paths of said selected transistors of the IC is above said given level, the enabling of different numbers of transistors occurring dynamically and continuously for different operating conditions.

26. The combination as claimed in claim 25 wherein each one of said first and second plurality of said IGFETs includes "M" transistors of the same conductivity type, where "M" is an integer greater than one (1).

27. An integrated circuit (IC) having a plurality of transistors comprising:

first and second power terminals for the application therebetween of an operating potential;

an output terminal;

M transistors of said plurality of transistors having their conduction paths connected in parallel between said first power terminal and said output terminal;

N transistors of said plurality of transistors having their conduction paths connected in parallel between said output terminal and said second power terminal; where M and N are integers greater than one;

means for turning on at least one of said M transistors when said output terminal is to be clamped to said first power terminal and means for turning on at least one of said N transistors when said output terminal is to be clamped to said second power terminal; and control means coupled to selected transistors taken from said plurality of transistors for sensing the equivalent impedance of the conduction paths of the selected transistors where the selected transistors are other than said M and N transistors, and responsive to the equivalent impedance of the conduction paths of said selected transistors for enabling additional ones of said M transistors in parallel with said at least one of said M transistors and additional ones of said N transistors in parallel with said at least one of said N transistors when the conductivity of the conduction paths of the selected transistors is below a certain level.

28. In an integrated circuit (IC) comprising a plurality of transistors, each transistor having a conduction path and a control electrode whose applied potential controls the conductivity of its conduction path, a combination comprising:

a network formed on said IC for biasing a selected transistor of the IC into conduction and for sensing the degree of conductivity of the conduction path of said selected transistor, said network having a network output at which is produced a first signal whose amplitude is proportional to, and indicative of, the degree of conductivity of the conduction path of said selected transistor, when it is turned on;

an output stage formed of the transistors of said IC, said output stage having first and second power terminals for the application therebetween of an operating potential, an input means and an output terminal for driving a load; and means, coupled between said network output and said input means of said output stage, responsive to the amplitude of said first signal for controlling the equivalent output impedance of said output stage, when said output stage is turned on, and for causing the equivalent output impedance to vary as an inverse function of the degree of conductivity of the conduction path of the selected transistor.

29. In the IC as claimed in claim 28 wherein said means coupled between said network output and said input means of said output stage for controlling the equivalent output impedance of said output stage includes means for increasing the equivalent output impedance of said output stage when the degree of conductivity of said selected transistor is high and for decreasing the equivalent output impedance of said output stage when the degree of conductivity of said selected transistor is low.

30. In the IC as claimed in claim 29 wherein said output stage includes a first plurality of transistors of one conductivity type having their conduction paths connected in parallel between said first power terminal and said output terminal and a second plurality of transistors of second conductivity type having their conduction paths connected in parallel between said output terminal and said second power terminal; and wherein said means for controlling the equivalent output impedance of said output stage includes means for controlling the total number of transistors of first plurality which are turned-on for one binary signal condition and the total number of transistors of second plurality which are turned-on for the other binary signal condition.

31. In an integrated circuit (IC) comprising a plurality of transistors, each transistor having first and second electrodes defining the ends of a conduction path and a control electrode, and wherein each transistor is designed to exhibit a certain equivalent impedance along its conduction path for a given turn-on voltage applied between its control electrode and its first electrode, and wherein the actual equivalent impedance of the conduction paths of the transistors of the IC may be different than their designed value due to variations in processing, temperature and the applied operating potential across the transistor, and wherein it is desirable that the circuits and networks formed on the IC respond in a more uniform manner to different processing and operating conditions;

means for sensing the equivalent impedance of the conduction path of a selected one of the transistors of the IC for a given turn-on voltage and for generating a control signal whose amplitude is indicative of the equivalent impedance of the selected transistor; and means responsive to the amplitude of the control signal for controlling the response of other transistors of the IC, other than said selected transistor, and rendering their response more uniform under different operating conditions for the same input signal condition.

32. An integrated circuit as claimed in claim 31 wherein said means for sensing the equivalent impedance includes and integrator for producing a control voltage whose amplitude is inversely proportional to the equivalent impedance of the selected transistor.

33. An integrated circuit as claimed in claim 31 wherein a first set of said other transistors have their conduction paths connected in parallel between a first power terminal and an output terminal and wherein a second set of said other transistors have their conduction paths connected in parallel between said output terminal and a second power terminal and wherein said control signal determines the total number of transistors rendered conductive in said first and second sets.

* * * * *